US012687572B2

(12) United States Patent　　　　　(10) Patent No.:　US 12,687,572 B2
　　　Ishii　　　　　　　　　　　　　　　(45) Date of Patent:　　　Jul. 21, 2026

(54) TEST METHOD

(71) Applicant: FUJI ELECTRIC CO., LTD.,
　　　　　　　Kanagawa (JP)

(72) Inventor: Kenichi Ishii, Matsumoto-city (JP)

(73) Assignee: FUJI ELECTRIC CO., LTD.,
　　　　　　　Kanagawa (JP)

( * ) Notice:　Subject to any disclaimer, the term of this
　　　　　　　patent is extended or adjusted under 35
　　　　　　　U.S.C. 154(b) by 198 days.

(21) Appl. No.: 18/581,263

(22) Filed:　　Feb. 19, 2024

(65)　　　　　Prior Publication Data

US 2024/0385235 A1　　Nov. 21, 2024

(30)　　　　Foreign Application Priority Data

May 17, 2023　(JP) ................................. 2023-081306

(51) Int. Cl.
　　　*G01R 31/26*　　　　(2020.01)
(52) U.S. Cl.
　　　CPC ..... *G01R 31/2608* (2013.01); *G01R 31/2621*
　　　　　　　　　　　　　　　　　　　　　(2013.01)
(58) Field of Classification Search
　　　CPC . G01R 31/26; G01R 31/2608; G01R 31/2621
　　　See application file for complete search history.

(56)　　　　　　References Cited

U.S. PATENT DOCUMENTS

| | | | |
|---|---|---|---|
| 2004/0036542 A1* | 2/2004 | Baba .................... | H03B 5/1852 |
| | | | 331/107 DP |
| 2015/0168468 A1* | 6/2015 | Peng ...................... | G01R 27/08 |
| | | | 324/719 |
| 2019/0064249 A1 | 2/2019 | Yoshida | |
| 2021/0255239 A1* | 8/2021 | Yoshida ............. | G01R 31/2875 |
| 2024/0159820 A1* | 5/2024 | Piette ................... | G01R 31/287 |

FOREIGN PATENT DOCUMENTS

WO　　　　2018092457 A1　　5/2018

* cited by examiner

*Primary Examiner* — Son T Le

(57)　　　　　　ABSTRACT

A test method of testing a test target transistor device is
provided, the test method including: arranging the test target
transistor device and a test transistor device in series
between a high voltage side wire and a low voltage side
wire; and causing a gate voltage applied to the test transistor
device to be higher than a gate voltage applied to the test
target transistor device. A difference between the gate volt-
age applied to the test transistor device and the gate voltage
applied to the test target transistor device may be 5.0 V or
less.

21 Claims, 5 Drawing Sheets

TEST METHOD

The contents of the following patent applications are incorporated herein by reference:

NO. 2023-081306 filed in JP on May 17, 2023.

BACKGROUND

1. Technical Field

The present invention relates to a test method for a semiconductor apparatus.

2. Related Art

Conventionally known is a semiconductor test circuit for testing a characteristic of a semiconductor apparatus such as IGBT (refer to Patent Document 1, for example).

Patent Document 1: WO/2018/092457

DESCRIPTION OF EXEMPLARY EMBODIMENTS

Hereinafter, embodiments of the present invention will be described. However, the following embodiments are not for limiting the invention according to the claims. In addition, not all of the combinations of features described in the embodiments are imperative to the solving means of the invention.

In the present specification, one side of a direction parallel to a depth direction of a semiconductor substrate (or a semiconductor apparatus) is referred to as "upper" and another side is referred to as "lower". One of two main surfaces of a substrate, a layer, or another member is referred to as an upper surface, and another is referred to as a lower surface. The "upper" and "lower" directions are not limited by a direction of gravity, or a direction in which the semiconductor apparatus is implemented.

In the present specification, technical matters may be described using orthogonal coordinate axes consisting of an X axis, a Y axis, and a Z axis. The orthogonal coordinate axes are merely for specifying relative positions of components, not for limiting to a specific direction. For example, the Z axis is not limited to indicate a height direction with respect to the ground. Note that, a +Z axis direction and a –Z axis direction are directions opposite to each other. When the Z axis direction is described without a plus or minus sign attached thereto, the direction is meant to be parallel to the +Z axis and the –Z axis.

In the present specification, orthogonal axes parallel to the upper surface and lower surface of the semiconductor substrate (or the semiconductor apparatus) are defined as the X axis and the Y axis. Moreover, an axis perpendicular to the upper surface and lower surface of the semiconductor substrate (or the semiconductor apparatus) is defined as the Z axis. In the present specification, the direction of the Z axis may be referred to as the depth direction. Moreover, in the present specification, a direction with the X axis and Y axis, being parallel to the upper surface and lower surface of the semiconductor substrate (or the semiconductor apparatus) may be referred to as a horizontal direction.

In the present specification, when a term such as "same" or "equal" is mentioned, there may be included an error caused from variation in manufacturing or the like. This error is within 10%, for example.

When describing positional relationship among devices in a circuit, the positional relationship among the devices on electrical paths may be described, not positional relationship in spatial positions of the devices. For example, when it is described that a first device is between two devices, the first device may be connected between the two devices on an electrical path. With regard to the spatial positions, the first device may be, or may not be arranged between the two devices.

Figure 1:
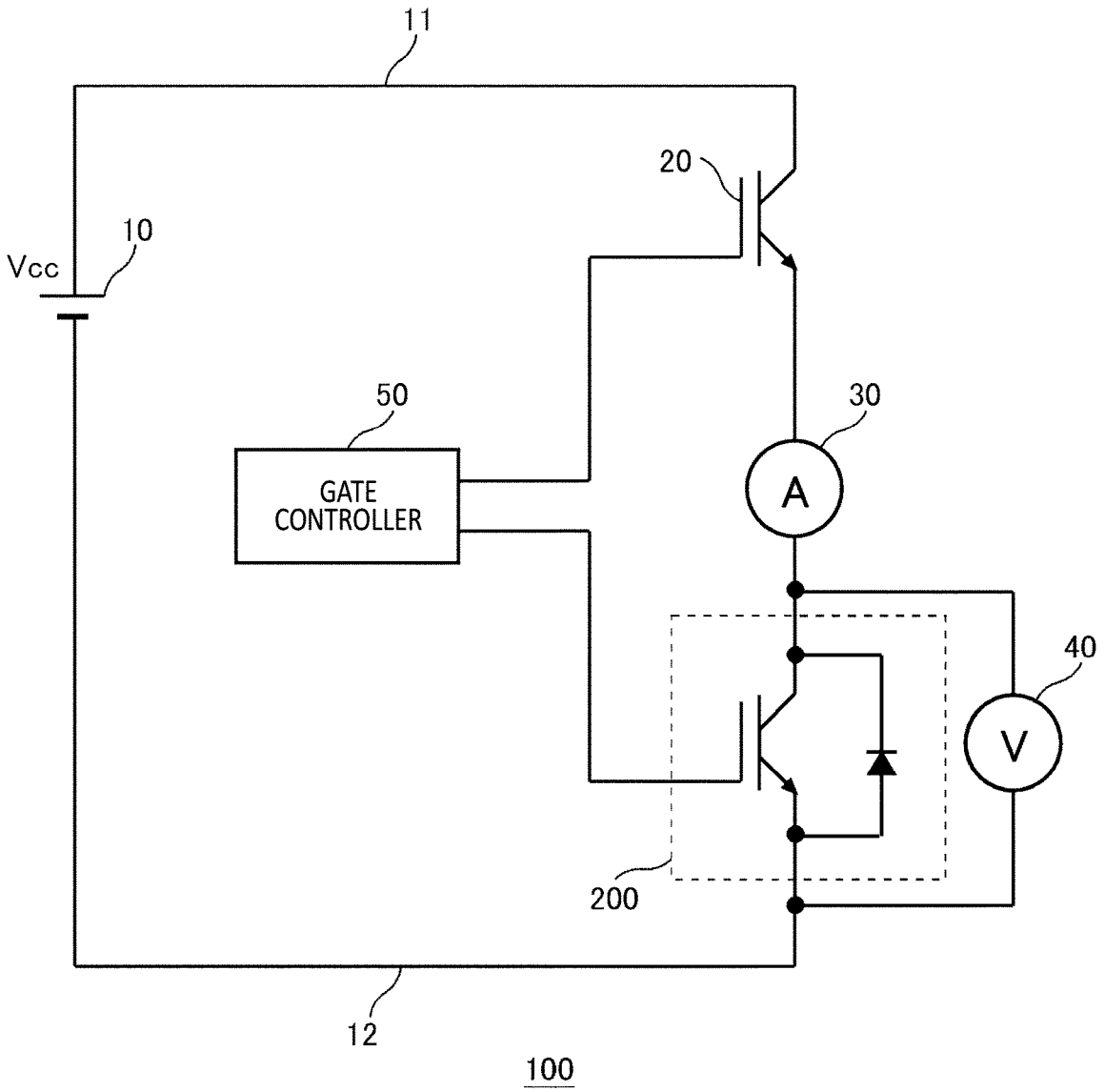
FIG. 1 illustrates an overview of a test apparatus 100 which tests a test target transistor device 200, according to one embodiment of the present invention.

FIG. 1 illustrates an overview of a test apparatus 100, according to one embodiment of the present invention. The test apparatus 100 tests a test target transistor device 200. The test target transistor device 200 may be an insulated gate bipolar transistor (IGBT), or another transistor device such as a MOSFET. The test target transistor device 200 may be formed on the same semiconductor substrate as that of a transistor device, and may include a diode device connected in reverse parallel with the transistor device. The diode device may be formed on a semiconductor substrate different from that of the transistor device. The test target transistor device 200 may be comprised of one chip. At a time of testing, the test target transistor device 200 may be in a form of a wafer on which multiple chips are formed, or may be in a form of a chip that is cut out from a wafer.

The test apparatus 100 tests the test target transistor device 200 for a short circuit. In a driver circuit, an inverter circuit, or the like, two transistor devices are provided in series between a high voltage side wire and a low voltage side wire, and a voltage at a connection point of the two transistor devices is output. In this circuit, the two transistor devices are controlled such that one of them is in an ON state while another is in an OFF state. However, some factor may cause the two transistor devices to be in ON states simultaneously. In that case, a flow of current penetrates between the high voltage side wire and the low voltage side wire, which results in a large current to flow into each transistor device. Such a state is called as the short circuit.

The test apparatus 100 measures characteristics of the test target transistor device 200 at a time when the test target transistor device 200 is short-circuited. For example, the test apparatus 100 measures a current waveform, voltage waveform, short circuit withstand capability, and the like when the test target transistor device 200 is short-circuited. The short circuit withstand capability is represented by a time integral value of currents that have been applied until immediately before the test target transistor device 200 experiences destructive failure, or a time integral value of energy (i.e., a product of applied currents and applied voltages) that have been applied until immediately before the test target transistor device 200 experiences destructive failure. The test apparatus 100 determines whether the test target transistor device 200 is in a good condition or in a bad condition, based on whether a measurement result satisfies a predetermined criterion. The test apparatus 100 may also determine, after causing the test target transistor device 200 to be short-circuited and then applying predetermined current or energy to the test target transistor device 200, whether a change in a characteristic such as an on-resistance etc. of the test target transistor device 200 is within a predetermined allowable range.

The test apparatus 100 includes a power supply 10, a high voltage side wire 11, a low voltage side wire 12, a test transistor device 20, an ammeter 30, a voltmeter 40, and a gate controller 50. The power supply 10 generates power to be supplied to the test target transistor device 200. The power supply 10 may be a DC power supply that generates a power source voltage Vcc. The high voltage side wire 11 is connected to a high voltage side terminal of the power supply 10, and applied with the power source voltage Vcc. The low voltage side wire 12 is connected to a low voltage side terminal of the power supply 10, and applied with a reference potential. The reference potential is a ground potential, for example.

The test transistor device 20 is arranged in series with the test target transistor device 200, between the high voltage side wire 11 and the low voltage side wire 12. In the example shown in FIG. 1, the test transistor device 20 is provided between the test target transistor device 200 and the high voltage side wire 11. In such architecture, because the test target transistor device 200 is connected to the low voltage side wire 12, voltage applied to the test target transistor device 200 can be easily measured with a criterion being a voltage (e.g., 0 V) of the low voltage side wire 12. In another example, the test transistor device 20 may be provided between the test target transistor device 200 and the low voltage side wire 12.

The gate controller 50 controls switching of the test transistor device 20 and the test target transistor device 200, by applying gate voltages to the test transistor device 20 and the test target transistor device 200. The gate controller 50 in the present example controls the test transistor device 20 to be in an ON state before controlling the test target transistor device 200 to be in an ON state. The gate controller 50 controls the test target transistor device 200 to be in the ON state after a predetermined time has passed since the test transistor device 20 was turned on. By means of such control, a short circuit test is performed under simulation of a short circuit state that occurs during implementation.

The ammeter 30 measures current that flows into the test target transistor device 200. The ammeter 30 may measure a time waveform of the current. The ammeter 30 of the present example is between the test target transistor device 200 and the test transistor device 20.

The voltmeter 40 measures voltage that is applied to the test target transistor device 200. The voltmeter 40 may measure a time waveform of the voltage. If the test target transistor device 200 is an IGBT, the voltmeter 40 measures an emitter-collector voltage. If the test target transistor device 200 is a MOSFET, the voltmeter 40 measures a source-drain voltage. The voltmeter 40 of the present example is provided in parallel with the test target transistor device 200.

In the short circuit test for the test target transistor device 200, current or energy corresponding to a test specification is applied to the test target transistor device 200. The test specification may be set by a manufacturer or user of the test target transistor device 200. If the current applied to the test target transistor device 200 varies, accuracy in the short circuit test is degraded. The current applied to the test target transistor device 200 is defined by the power source voltage Vcc and a combined resistance connected to the power supply 10. For example, the combined resistance is defined by resistances of wires, resistances of connection at connect portions, an on-resistance of the test transistor device 20, and an on-resistance of the test target transistor device 200.

While the power source voltage Vcc used for the test has a fixed value, resistances vary from one another considering variation that occur in mass production. For example, there is variation in the on-resistance of the test target transistor device 200 and variation in the on-resistance of the test transistor device 20. Therefore, voltage and current applied to the test target transistor device 200 have no constant values, so as applied energy. If a resistance value other than that of the test target transistor device 200 varies largely, the test target transistor device 200 may be misjudged as a defective product regardless of a fact that it is a non-defective product.

The gate controller 50 of the present example causes a gate voltage applied for turning on the test transistor device 20 to be higher than a gate voltage applied for turning on the test target transistor device 200. In the present specification, a gate voltage applied for turning on a transistor device may be simply referred to as a gate voltage applied to the transistor device. The gate voltage applied to each transistor device is higher than a threshold voltage of the each transistor device. The gate controller 50 may cause a difference between the gate voltage and the threshold voltage of the test transistor device 20 to be larger than a difference between the gate voltage and the threshold voltage of the test target transistor device 200. The test transistor device 20 and the test target transistor device 200 of the present example may be designed so as to have the same threshold voltage. The test transistor device 20 and the test target transistor device 200 may have the same structure.

If the threshold voltage of the test transistor device 20 varies, the difference between the threshold voltage and the gate voltage varies. Therefore, the on-resistance of the test transistor device 20 varies. Variation in the on-resistance of the test transistor device 20 causes variation in current applied to the test target transistor device 200. Increasing the gate voltage applied to the test transistor device 20 enables reduction in a ratio of a variation component of the threshold voltage to the difference between the threshold voltage and the gate voltage. Therefore, a variation ratio of the on-resistance can be made small. In this way, the variation in current applied to the test target transistor device 200 can be reduced.

A difference between the gate voltage applied to the test transistor device 20 and the gate voltage applied to the test target transistor device 200 may be 0.1 V or more. This difference may be 0.2 V or more, 0.5 V or more, or 1.0 V or more. By making this difference large, the variation in the on-resistance of the test transistor device 20 will be easily reduced. This difference can be 5.0 V or less. This difference can also be 2.0 V or less. If this difference is made too large, it will be difficult to make the gate voltage applied to the test target transistor device 200 large enough relative to the threshold voltage.

The gate controller 50 may control the gate voltage of the test target transistor device 200 and the gate voltage of the test transistor device 20 such that a test current defined by the test specification flows into the test target transistor device 200. For example, if constant values are specified for the power source voltage Vcc and the test current by the test specification, the gate controller 50 may decrease the gate voltage of the test target transistor device 200 more, upon increasing the gate voltage of the test transistor device 20 more. The gate controller 50 that has lowered the on-resistance of the test transistor device 20 may raise the on-resistance of the test target transistor device 200 by the lowered amount.

There may be a case where the power source voltage Vcc is permitted by the test specification to change. For example, there may also be a case where the emitter-collector voltage is specified for the test target transistor device 200, whereas the power source voltage Vcc is not specified. In such a case, the test apparatus 100 may control the gate voltage of the test transistor device 20 and the power source voltage Vcc to be applied to the high voltage side wire 11, such that a test current defined by the test specification will flow into the test target transistor device 200. For example, if the gate controller 50 increase the gate voltage of the test transistor device 20 more, the power supply 10 decrease the power source voltage Vcc more. By virtue of such control, variation in the on-resistance of the test transistor device 20 can be reduced while maintaining the current or energy applied to the test target transistor device 200.

The test apparatus 100 may control the gate voltage of the test transistor device 20 and a test time in which the test current flows into the test target transistor device 200, such that energy defined by the test specification is applied to the test target transistor device 200. For example, the test apparatus 100 may shorten this test time more, upon increasing the gate voltage of the test transistor device 20 more. By virtue of such control, variation in the on-resistance of the test transistor device 20 can be reduced while maintaining the energy (a time integral value of currents or a time integral value of products of currents and voltages) applied to the test target transistor device 200. This test time may be controlled by the gate controller 50. For example, if this test time has finished, the gate controller 50 may control the test transistor device 20 to be in an OFF state.

Figure 2:
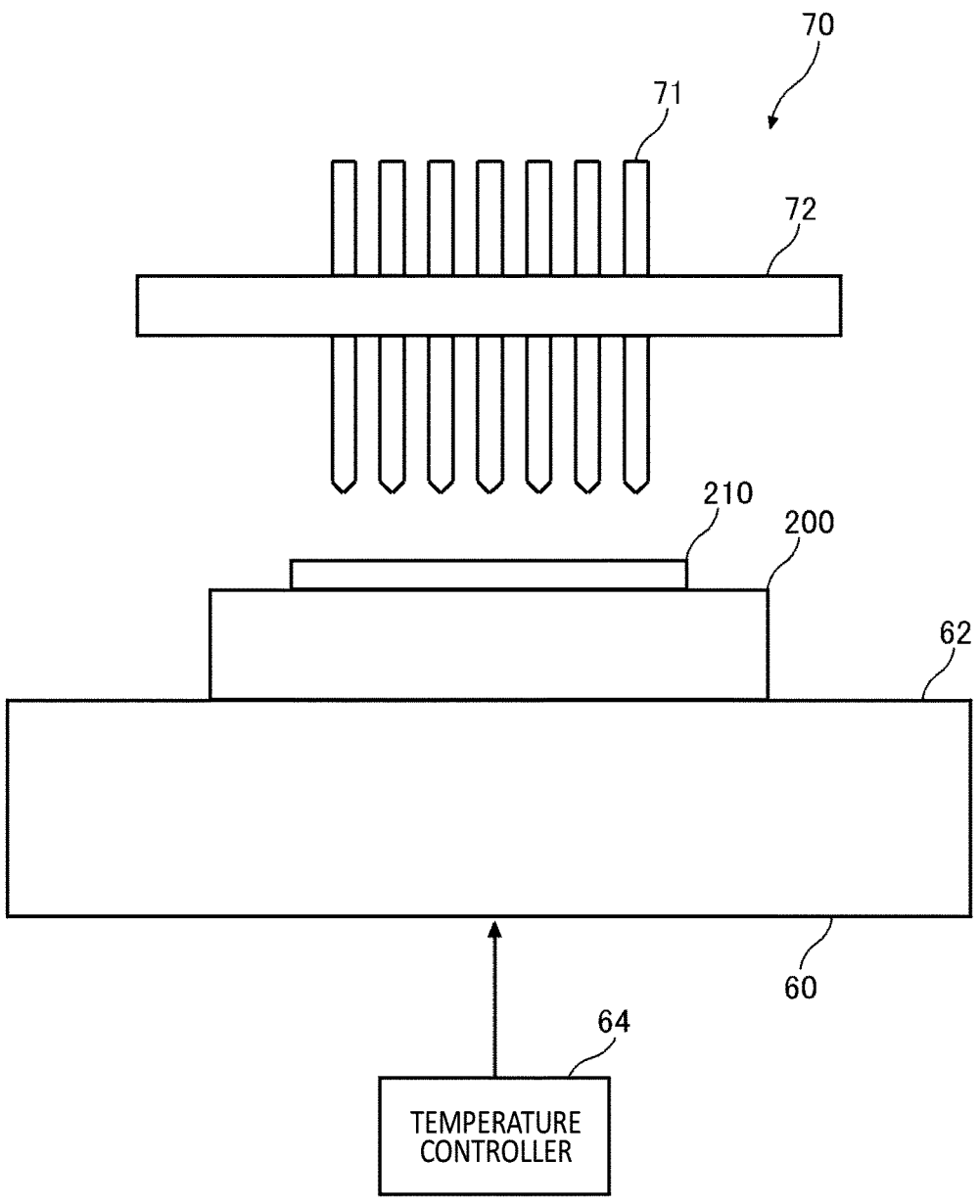
FIG. 2 illustrates examples of a stage 60 on which the test target transistor device 200 is mounted and a probe 70 which comes into contact with the test target transistor device 200.

FIG. 2 illustrates examples of a stage 60 on which the test target transistor device 200 is mounted and a probe 70 which comes into contact with the test target transistor device 200. A test apparatus 100 of the present example includes the stage 60, a temperature controller 64, and the probe 70.

The test target transistor device 200 has a pad 210 through which a main current flows, on its upper surface. For example, the main current is a current that flows between an emitter and a collector, or between a source and a drain. For example, the pad 210 is an emitter pad or a collector pad. Either the emitter pad or the collector pad may be the pad 210, and another may be provided on a lower surface of the test target transistor device 200.

The stage 60 has a mounting surface 62 on which the test target transistor device 200 is mounted. The mounting surface 62 may have a wire that is electrically connected to the pad on the lower surface of the test target transistor device 200. At least a part of the mounting surface 62 may be gold plated. For example, a front surface of an electrical wire provided on the mounting surface 62 may be gold plated. This prevents degradation of this wire, so that resistance of connection between the test target transistor device 200 and the stage 60 can be prevented from varying.

The temperature controller 64 controls temperature of the stage 60. Thereby, temperature of the test target transistor device 200 is controlled, so that current that flows into the test target transistor device 200 can be adjusted. The test apparatus 100 may control the gate voltage of the test transistor device 20 and the temperature of the stage 60 such that a test current defined by the test specification flows into the test target transistor device 200. For example, if the gate controller 50 increase the gate voltage of the test transistor device 20 more, the temperature controller 64 may control the temperature of the stage 60 to be decreased more.

The probe 70 has one or more probe pins 71 that contact with the pad 210. The one or more probe pins 71 may be fixed by a fixing part 72. The test apparatus 100 may test multiple test target transistor devices 200 by replacing one test target transistor device 200 mounted on the stage 60 with another test target transistor device 200. Each of the multiple test target transistor devices 200 may be of the same type with the same structure as another, or be of different type with structure different from another.

The gate controller 50 may adjust the gate voltage of the test transistor device 20 for every test target transistor device 200 being an object to be tested. The gate controller 50 may change the gate voltage of the test transistor device 20 when a test target transistor device 200 having different structure is tested. Resistance of contact between the probe 70 and the pad 210 may vary if a shape or a size (e.g. an area of an upper surface) of the pad 210 of the test target transistor device 200 changes. The gate controller 50 may compensate the variation in this resistance of contact by adjusting the on-resistance of the test transistor device 20. The gate controller 50 may control the gate voltage of the test transistor device 20 based on the size of the pad 210 of the test target transistor device 200. For example, the smaller the pad 210 is, the more the gate controller 50 increases the gate voltage of the test transistor device 20. The gate controller 50 may be registered in advance with relationship between the size of the pad 210 and the gate voltage that should be applied to the test transistor device 20. This relationship may be experimentally decided or decided through an arithmetic operation such as simulation, in advance.

Multiple types of probes 70 may be prepared for the test apparatus 100. The probes 70 may be different from each other, in regard to the number of the probe pins 71, space between the probe pins 71, resistances of the probe pins 71, etc. The test apparatus 100 may use the probe 70 that corresponds to a type of the test target transistor device 200.

Replacing the probe 70 may cause a resistance at the probe 70, and a resistance of connection between the probe 70 and the pad 210 to vary. The gate controller 50 may control the gate voltage of the test transistor device 20 based on a type of the probe 70 to be connected to the pad 210 of the test target transistor device 200. The gate controller 50 may adjust the on-resistance of the test transistor device 20 such that the variation in the resistance of connection between the probe 70 and the pad 210 caused by replacing the probe 70 is compensated. As described above, the on-resistance of the test transistor device 20 can be adjusted by the gate voltage. The gate controller 50 may be stored in advance with information representing how much the gate voltage should be varied for every type of the probe 70. This information may be experimentally decided or decided through an arithmetic operation such as simulation, in advance.

Because multiple test target transistor devices 200 that are tested in succession are products manufactured in mass production in the same period of time, there is relatively small variation among their threshold voltages. On the other hand, the test transistor device 20 may experience characteristic degradation or destructive failure from repeating the test. In such a case, the test transistor device 20 is replaced. There may be relatively large variation between a threshold voltage of the test transistor device 20 before the replacement and a threshold voltage of the test transistor device 20 after the replacement. As described in the present example, by increasing the gate voltage of the test transistor device 20, the variation in the on-resistance, which is caused by the variation in the threshold voltages of the test transistor devices 20, can be reduced. The gate voltage of the test transistor device 20 may be decided depending on the threshold voltage of the test transistor device 20, every time the test transistor device 20 is replaced or at a predetermined timing.

A resistance value of a current path in which the test current flows can also be adjusted by providing a variable resistance element etc. However, providing the variable resistance element etc. increases circuit scale. In the present example, merely by adjusting the gate voltage of the test transistor device 20, no additional element needs to be provided.

Figure 3:
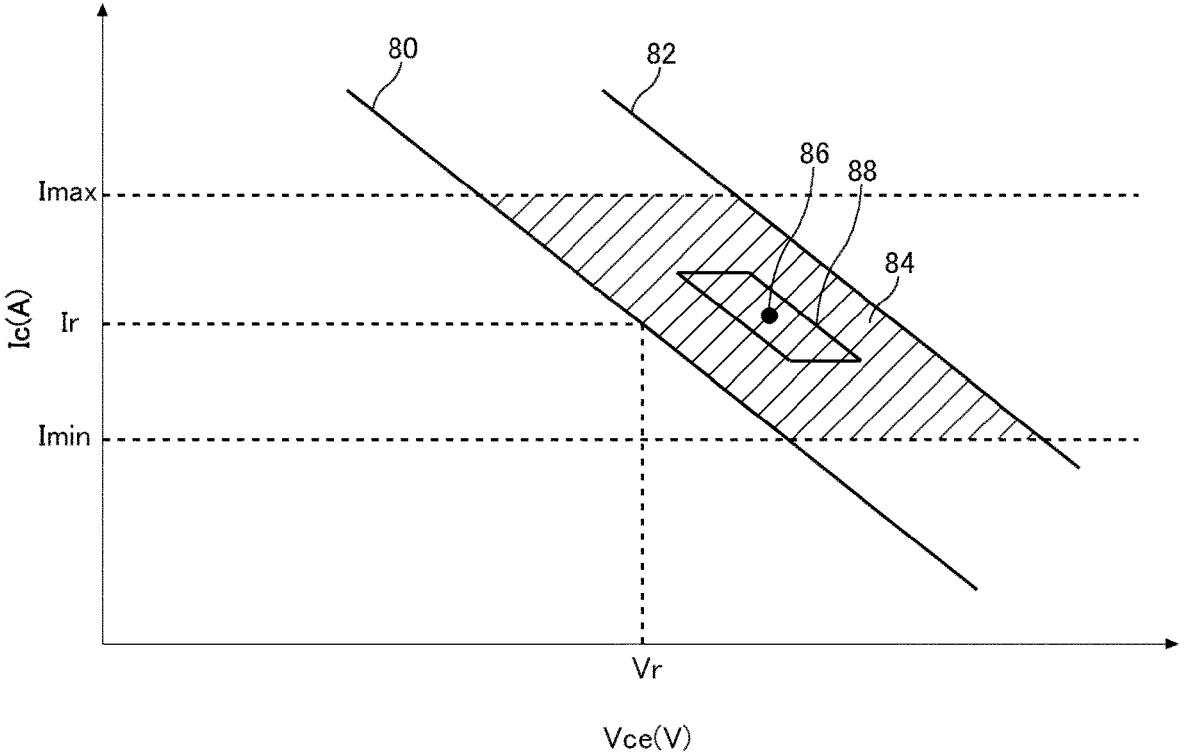
FIG. 3 illustrates examples of an emitter-collector voltage Vce and a collector current Ic which are applied to the test target transistor device 200.

FIG. 3 illustrates examples of an emitter-collector voltage Vce and a collector current Ic which are applied to the test target transistor device 200. An upper limit value Imax of the collector current Ic is specified by characteristics of the test apparatus 100. For example, the upper limit value Imax of the collector current Ic is set by a resistance of the probe 70, etc. Also, a lower limit value Imin of the collector current Ic is set as a test specification for the test target transistor device 200.

A rated voltage and a rated current of the test target transistor device 200 are shown as Vr and Ir, respectively. A straight line 80 shows a voltage and a current which produce applied energy the same as that produced by the voltage Vr and the current Ir. A straight line 82 shows energy that can be applied to a normal test target transistor device 200. In other words, the test target transistor device 200 faces a possibility of destructive failure if energy larger than that shown by the straight line 82 is applied.

The voltage Vce and the current Ic in a region 84 that is shown by diagonal hatching in FIG. 3 are selected and applied to the test target transistor device 200 for testing. However, if variation occur in the on-resistances of the test target transistor device 200 and the test transistor device 20, variation occur in the voltage Vce and the current Ic. For example, when the voltage Vce and the current Ic shown by a set-point 86 are applied to the test target transistor device 200, the voltage Vce and the current Ic vary within a range shown by a region 88. In such a case, the set-point 86 must be set such that the region 88 is entirely included in the region 84. Therefore, settable ranges for the voltage Vce and the current Ic are narrowed. In the present example, because the variation in the on-resistance of the test transistor device 20 can be reduced, the variation in the voltage Vce and the current Ic can be reduced. Accordingly, the settable ranges for the voltage Vce and the current Ic used for the test can be widened.

Figure 4:
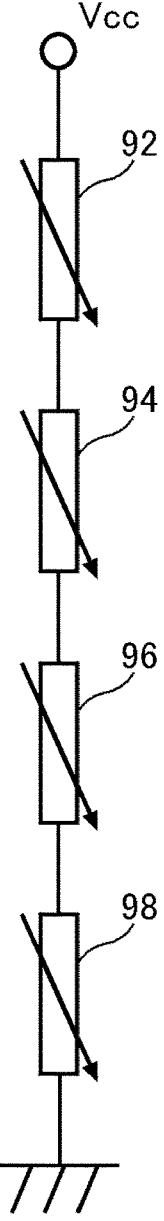
FIG. 4 schematically illustrates resistors in the test apparatus 100 and on-resistance of the test target transistor device 200.

FIG. 4 schematically illustrates resistors in the test apparatus 100 and on-resistance of the test target transistor device 200. A resistor 92 corresponds to resistances in all wires from the high voltage side terminal of the power supply 10 to the reference potential. A resistor 94 corresponds to resistances of connection of all connect portions from the high voltage side terminal of the power supply 10 to the reference potential. For example, the resistor 94 includes the resistance of connection between the probe 70 and the pad 210, and the resistance of connection between the pad provided on the lower surface of the test target transistor device 200 and the wire of the stage 60. A resistor 96 corresponds to the on-resistance of the test transistor device 20. A resistor 98 corresponds to the on-resistance of the test target transistor device 200.

If variation occurs in each resistor, the current Ic that flows from the power supply 10 varies. In addition, because a resistance ratio varies thereby, the voltage Vce applied to the test target transistor device 200 varies also. In the present example, by increasing the gate voltage of the test transistor device 20, variation in the on-resistance (resistor 96) of the test transistor device 20 is reduced. Thereby, the variation in the current Ic and the voltage Vce can be reduced. Accordingly, the test target transistor device 200 can be tested with high accuracy, and further, degrees of freedom can be improved in setting the current Ic and the voltage Vce that are used at a time of testing. The on-resistance of the test target transistor device 200 is usually large compared to the resistors 92 and 94. Therefore, by reducing the variation in the on-resistance of the test target transistor device 200, variation in a combined resistance value of the multiple resistors can be effectively reduced.

If the on-resistance of the test transistor device 20 is made small, the combined resistance becomes small, thus the current Ic increases. With regard to this, the test apparatus 100 may prevent: the increase in the current Ic by adjusting the power source voltage Vcc; increase in the applied energy by shortening the test time; and increase in the current Ic by adjusting temperature of the stage 60. In addition, the combined resistance may be prevented from varying by adjusting the gate voltage of the test target transistor device 200, thus adjusting the on-resistance (resistor 98).

Figure 5:
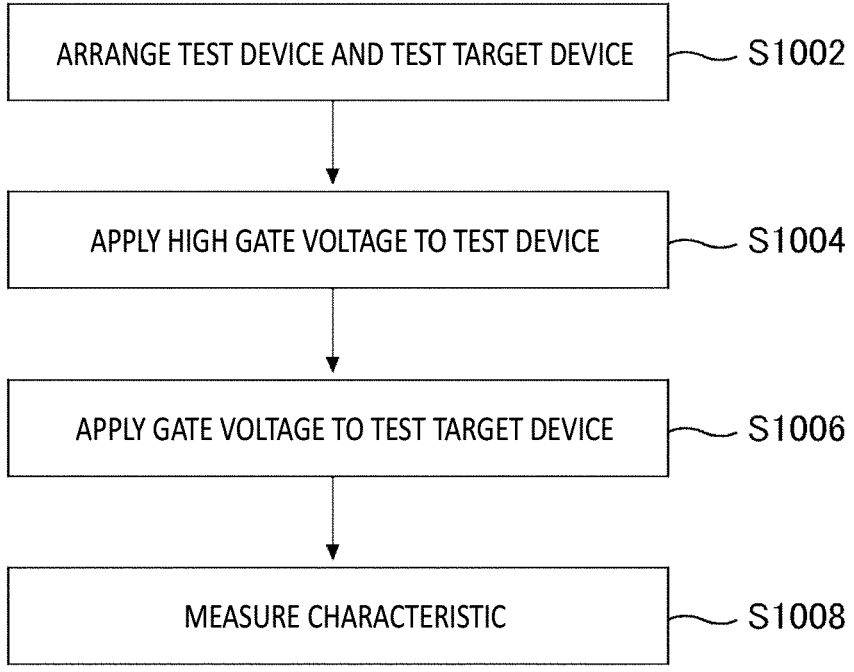
FIG. 5 is a flowchart for explaining an overview of a test method performed by the test apparatus 100.

FIG. 5 is a flowchart for explaining an overview of a test method performed by the test apparatus 100. While a part of contents of the test method is described in FIG. 5, the test that has been described for each embodiment shown from FIG. 1 to FIG. 4 can be performed by this test method.

In a preparation step S1002, the test target transistor device 200 and the test transistor device 20 are arranged in series between the high voltage side wire 11 and the low voltage side wire 12. By way of example, the test target transistor device 200 is mounted on the mounting surface 62 of the stage 60.

In a test device ON step S1004, the test transistor device 20 is applied with a predetermined gate voltage and thereby controlled to be in an ON state. The gate voltage applied to the test transistor device 20 is higher than a gate voltage for controlling the test target transistor device 200 to be in an ON state. In S1004, the test target transistor device 200 is controlled to be in an OFF state.

In a test target device ON step S1006, the test target transistor device 200 is applied with a predetermined gate voltage and thereby controlled to be in an ON state. For example, the gate voltage applied to the test target transistor device 200 is higher than the threshold voltage by 4 V. On the other hand, the gate voltage applied to the test transistor device 20 is higher than the threshold voltage by 4.1 V to 6 V. The threshold voltage may be the same for the test target transistor device 200 and the test transistor device 20.

In S1004 or S1006, at least one of the power source voltage Vcc, the test time, temperature of the stage 60, or the gate voltage applied to the test target transistor device 200 may be adjusted depending on the gate voltage applied to the test transistor device 20. In S1004 or S1006, at least one of the power source voltage Vcc, the test time, the temperature of stage 60, or the gate voltage applied to the test target transistor device 200 may be adjusted such that a value of current or energy applied to the test target transistor device 200 becomes a set value. The test apparatus 100 may adjust a combination of any of: the power source voltage Vcc; the test time; the temperature of stage 60; and the gate voltage applied to the test target transistor device 200.

In a measurement step S1008, a characteristic of the test target transistor device 200 is measured. In the measurement step S1008, short circuit withstand capability or another characteristic of the test target transistor device 200 may be measured. The test method of the present example can reduce variation in the on-resistance of the test transistor device 20. Therefore, the test target transistor device 200 can be tested with high accuracy, and further, degrees of freedom can be improved in setting the voltage Vce and the current Ic.

While the present invention has been described above by using the embodiments, the technical scope of the present invention is not limited to the scope of the above-described embodiments. It is apparent to persons skilled in the art that various alterations or improvements can be made to the above-described embodiments. It is also apparent from description of the claims that the embodiments to which such alterations or improvements are made can be included in the technical scope of the present invention.

What is claimed is:

1. A test method of testing a test target transistor device, comprising:
arranging the test target transistor device and a test transistor device in series between a high voltage side wire and a low voltage side wire; and
causing a gate voltage applied to the test transistor device to be higher than a gate voltage applied to the test target transistor device, wherein
the gate voltage of the test transistor device is adjustable for every test target transistor device that is the test target transistor device.

2. The test method according to claim 1, wherein the test transistor device is arranged between the test target transistor device and the high voltage side wire.

3. The test method according to claim 1, wherein a difference between the gate voltage applied to the test transistor device and the gate voltage applied to the test target transistor device is 5.0 V or less.

4. The test method according to claim 1, wherein the gate voltage of the test target transistor device and the gate voltage of the test transistor device are controlled such that a test current defined by a test specification flows into the test target transistor device.

5. The test method according to claim 4, wherein when the gate voltage of the test transistor device is increased more, the gate voltage of the test target transistor device is decreased more.

6. The test method according to claim 1, wherein the gate voltage of the test transistor device and a power supply voltage applied to the high voltage side wire are controlled such that a test current defined by a test specification flows into the test target transistor device.

7. The test method according to claim 6, wherein when the gate voltage of the test transistor device is increased more, the power supply voltage is decreased more.

8. The test method according to claim 1, wherein the gate voltage of the test transistor device and a test time in which a test current flows into the test target transistor device are controlled such that energy defined by a test specification is applied to the test target transistor device.

9. The test method according to claim 8, wherein when the gate voltage of the test transistor device is increased more, the test time is shortened more.

10. The test method according to claim 1, wherein the gate voltage of the test transistor device and temperature of a stage on which the test target transistor device is mounted are controlled such that a test current defined by a test specification flows into the test target transistor device.

11. The test method according to claim 10, wherein when the gate voltage of the test transistor device is increased more, the temperature of the stage is decreased more.

12. The test method according to claim 1, wherein the gate voltage of the test transistor device is controlled based on a size of a pad of the test target transistor device.

13. The test method according to claim 1, wherein:
multiple types of probes to be connected to a pad of the test target transistor device are prepared; and
the gate voltage of the test transistor device is controlled based on a type of a probe connected to the pad of the test target transistor device among the multiple types of probes.

14. The test method according to claim 1, wherein on a stage for mounting the test target transistor device, a mounting surface on which the test target transistor device is mounted is gold plated.

15. The test method according to claim 2, wherein the gate voltage of the test target transistor device and the gate voltage of the test transistor device are controlled such that a test current defined by a test specification flows into the test target transistor device.

16. The test method according to claim 3, wherein the gate voltage of the test target transistor device and the gate voltage of the test transistor device are controlled such that a test current defined by a test specification flows into the test target transistor device.

17. The test method according to claim 2, wherein the gate voltage of the test transistor device and a power supply voltage applied to the high voltage side wire are controlled such that a test current defined by a test specification flows into the test target transistor device.

18. The test method according to claim 3, wherein the gate voltage of the test transistor device and a power supply voltage applied to the high voltage side wire are controlled such that a test current defined by a test specification flows into the test target transistor device.

19. The test method according to claim 2, wherein the gate voltage of the test transistor device and a test time in which a test current flows into the test target transistor device are controlled such that energy defined by a test specification is applied to the test target transistor device.

20. A test method of testing a test target transistor device, comprising:
arranging the test target transistor device and a test transistor device in series between a high voltage side wire and a low voltage side wire; and
causing a gate voltage applied to the test transistor device to be higher than a gate voltage applied to the test target transistor device, wherein
the gate voltage of the test transistor device is controlled based on a size of a pad of the test target transistor device.

21. A test method of testing a test target transistor device, comprising:
arranging the test target transistor device and a test transistor device in series between a high voltage side wire and a low voltage side wire; and causing a gate voltage applied to the test transistor device to control the test transistor device to be in an ON state to be higher than a gate voltage applied to the test target transistor device to control the test target transistor device to be in an ON state, wherein the testing is for a short circuit, wherein the gate voltage of the test transistor device is adjustable for every test target transistor device that is the test target transistor device.

* * * * *